(12) United States Patent
Ramkumar et al.

(10) Patent No.: US 7,390,750 B1
(45) Date of Patent: Jun. 24, 2008

(54) METHOD OF PATTERNING ELEMENTS WITHIN A SEMICONDUCTOR TOPOGRAPHY

(75) Inventors: Krishnaswamy Ramkumar, San Jose, CA (US); Alain P. Blosse, Belmont, CA (US); James A. Hunter, Campbell, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 323 days.

(21) Appl. No.: 11/087,924

(22) Filed: Mar. 23, 2005

Related U.S. Application Data

(60) Provisional application No. 60/555,633, filed on Mar. 23, 2004.

(51) Int. Cl.
*H01L 21/302* (2006.01)
(52) U.S. Cl. .................. 438/706; 438/717; 438/718; 438/719; 438/723; 438/743
(58) Field of Classification Search ............... 438/694, 438/706, 717, 718, 719, 743; 252/79.1
See application file for complete search history.

(56) References Cited

U.S. PATENT DOCUMENTS

| | | | |
|---|---|---|---|
| 6,507,044 B1 * | 1/2003 | Santana et al. ............... 257/48 |
| 6,703,298 B2 * | 3/2004 | Roizin et al. ................. 438/593 |
| 6,753,216 B2 * | 6/2004 | Mathew et al. .............. 438/199 |
| 2004/0043623 A1 * | 3/2004 | Liu et al. ..................... 438/736 |
| 2005/0059188 A1 * | 3/2005 | Bolken et al. ............... 438/106 |

\* cited by examiner

*Primary Examiner*—Binh X. Tran
(74) *Attorney, Agent, or Firm*—Kevin L. Daffer; Mollie E. Lettang; Daffer McDaniel, LLP

(57) ABSTRACT

A method is provided which includes forming a hardmask feature adjacent to a patterned sacrificial structure of a semiconductor topography, selectively removing the patterned sacrificial structure to expose a lower layer and etching exposed portions of the lower layer in alignment with the hardmask feature. In some embodiments, forming the hardmask feature may include conformably depositing a hardmask material above the patterned sacrificial structure and lower layer as well as blanket etching the hardmask material such that upper surfaces of the patterned sacrificial structure and portions of the lower layer are exposed and portions of the hardmask material remain along sidewalls of the patterned sacrificial structure. The method may be applied to produce an exemplary semiconductor topography including a plurality of gate structures each having a width less than approximately 70 nm, wherein a variation of the widths among the plurality of gate structures is less than approximately 10%.

15 Claims, 3 Drawing Sheets

METHOD OF PATTERNING ELEMENTS WITHIN A SEMICONDUCTOR TOPOGRAPHY

PRIORITY APPLICATION

The present application claims priority to provisional application No. 60/555,633 entitled "Method of Defining Elements in a Semiconductor Device" filed Mar. 23, 2004.

BACKGROUND OF THE INVENTION

1. Field of the Invention

The present invention relates generally to processes for fabricating integrated circuits and semiconductor devices, and more particularly to a method of patterning elements in a semiconductor topography and a semiconductor device formed thereby.

2. Description of the Related Art

The following descriptions and examples are given as background information only.

A pervasive trend in modern integrated circuit manufacture is to produce integrated circuits (IC) with feature sizes as small as possible. Smaller feature sizes may allow more IC elements to be placed on a single substrate. In addition, ICs with smaller feature sizes may function faster and/or at lower threshold voltages than ICs having larger feature sizes. For example, the continuous scaling of very large scale integrated circuit (VLSI) technologies has required dimensions of gates in some field effect transistor (FET) technologies to shrink to less than approximately 100 nanometers (nm) in order to provide desired FET performance. IC feature sizes, however, may be limited by the image resolution or, more specifically, the wavelength of the photolithographic equipment used to form the features. For example, the minimum resolvable feature size of a 248 nm photolithographic tool may be approximately 0.14 microns. As such, in order to obtain a structure with a smaller feature size, a smaller wavelength photolithographic tool may need to be used.

There are, however, disadvantages with using smaller wavelength photolithographic tools. In particular, photolithographic tools are typically expensive and therefore, purchasing new photolithographic tools for each new development of ICs with reduced feature sizes may be cost prohibitive. Furthermore, smaller wavelength photolithographic tools may require substantial process development to produce smaller feature sizes. In addition, the thicknesses and materials used for photoresist films and underlying anti-reflective layers may be dependent on the wavelength used with the photolithographic tool and therefore, may need to be revised for consistency with the new photolithographic tools. In some cases, problems, such as poor image resolution, poor etch selectivity, or patterning clarity such as line edge roughness, may arise with such immature technologies and chemistries. As a result, the installation of new photolithographic equipment and its associated chemistry may delay the development of integrated circuits with reduced feature sizes. Furthermore, the wavelength of light presently used for lithography is already in the deep ultraviolet range and at such wavelengths the absorption of light by components in the lithography tool is considerable. Thus, it may not be possible to produce circuit elements having dimensions of 100 nm or less by simply reducing the wavelength lithography light source.

One method of producing IC elements with dimensions smaller than dimensions obtainable by a photolithographic tool is "resist trimming." In resist trimming, a resist is first patterned to a dimension within the capability limit of the lithography tool. The pattern is then trimmed in an etch tool to a narrower, desired dimension, and the semiconductor topography is etched using the trimmed resist pattern. Although an improvement over conventional lithographic techniques, the resist trimming approach is not wholly satisfactory for a number of reasons. For instance, dimension uniformity among a plurality of patterned elements is significantly degraded by the resist trimming, thereby reducing the utility of this approach for mass commercial production of ICs having dimensions below the resolution of the lithography tool. Moreover, resist trimming typically reduces both width and length dimensions of a structure. Consequently, although it may be advantageous to reduce one dimension of a structure, such as width for example, the other dimension of the structure will also be reduced, possibly beyond the design specifications of the structure. In addition, resist trimming may undesirably increase spacing distances between structures, sometimes out of the design specifications of the device.

Accordingly, there is a need for a method of patterning or defining elements within a semiconductor topography that is not limited by the capabilities of lithographic tools or processes. It is further desirable that the method provide elements having smaller and/or more uniform dimensions than those that may be achieved by advanced lithographic tools and/or resist trimming processes. Moreover, it would be advantageous to develop a method patterning elements within a semiconductor topography a lower cost than such processes.

SUMMARY OF THE INVENTION

The problems outlined above may be in large part addressed by a method for patterning elements within a semiconductor topography. The following are mere exemplary embodiments of the method and an exemplary semiconductor topography resulting therefrom and are not to be construed in any way to limit the subject matter of the claims.

One embodiment of the method includes forming a hardmask feature adjacent to a patterned sacrificial structure of a semiconductor topography, selectively removing the patterned sacrificial structure to expose an underlying layer and etching exposed portions of the underlying layer in alignment with the hardmask feature.

Another embodiment of the method includes conformably depositing a hardmask material above a patterned sacrificial structure and adjacent regions of a lower layer of a semiconductor topography. The embodiment further includes blanket etching the hardmask material such that upper surfaces of the patterned sacrificial structure and portions of the adjacent regions of the lower layer are exposed and portions of the hardmask material remain along sidewalls of the patterned sacrificial structure. Subsequent to blanket etching of hardmask material, the sacrificial structure is selectively removed to expose an underlying region of the lower layer and exposed portions of the adjacent and underlying regions of the lower layer are etched in alignment with the remaining portions of the hardmask material.

An embodiment of the semiconductor topography includes a plurality of gate structures each having a width less than approximately 70 nm, wherein a variation of the widths among the plurality of gate structures is less than approximately 10%.

BRIEF DESCRIPTION OF THE DRAWINGS

These and various other features and advantages of the present invention will be apparent upon reading of the following detailed description in conjunction with the accompanying drawings and the appended claims provided below, where:

FIG. 5 is a partial cross-sectional view of the semiconductor topography in which remaining portions of the sacrificial layer are removed subsequent to the removal of the portions of the deposited layer in FIG. 4a;

Figure 1:
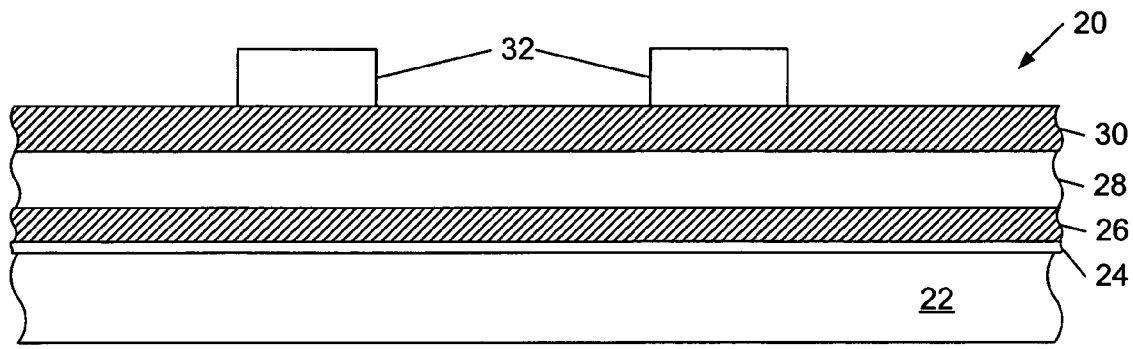
FIG. 1 is a partial cross-sectional view of a semiconductor topography including patterned resist structures arranged over a stack of layers.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary method for patterning elements within a semiconductor topography is provided. In particular, FIGS. 1-7 depict a process in which a hardmask feature is formed adjacent to a patterned sacrificial structure of a semiconductor topography and, subsequent to removing the patterned sacrificial structure, exposed portions of an underlying layer are etched in alignment with the hardmask feature. As will be described in more detail below, the method may be particularly applicable for patterning elements with small dimensions. More specifically, the method may be advantageous for patterning elements with dimensions smaller than which may be readily formed by photolithographic tools. In addition, the method described herein may be advantageous for patterning elements having a small variation of dimensions, such as less than approximately 10%, for example. It is noted, however, that the method is not necessarily so restricted and, therefore, the method may, in some embodiments, be used to form elements with dimensions substantially equal to or greater than which may be formed by photolithographic tools and/or with relatively wide variations of dimensions. It is further noted that the method may be applied to pattern any feature within a semiconductor topography, but may be particularly applicable to patterning gate structures due to their steadily decreasing feature size specifications in the industry.

FIG. 1 illustrates a partial cross-sectional view of semiconductor topography 20 including patterned resist structures 32 arranged over a stack of layers. In general, resist structures 32 includes a photoresist material, such as a deep ultraviolet resist, an I-line resist, a G-line resist, or another resist, such as an e-beam resist or an x-ray resist. In addition, resist structures 32 may, in some embodiments, include an anti-reflective layer disposed below the photoresist material. The thickness of resist structures 32 may generally be between approximately 2000 angstroms and approximately 10,000 angstroms, however, larger or smaller thicknesses may be used. Although two resist structures 32 are shown in FIG. 1, any number of resist structures may be patterned upon semiconductor topography 20 in accordance with design specifications of the ensuing device.

In general, the process used to pattern resist structures 32 may include photolithography techniques known in the semiconductor industry. As noted below, hardmask features will be subsequently formed relative to the position of sacrificial structures formed from semiconductor topography 20 and the hardmask features will be used to pattern integrated circuit elements, such as but not limited to gate structures and interconnect lines. The sacrificial structures will be patterned from resist structures 32 and, therefore, the widths of resist structure 32 and the spacings therebetween may be configured to fulfill the design specifications for spacings between devices structures fabricated from the hardmask features. For example, in embodiments in which gate structures are fabricated from semiconductor topography 20, the widths of resist structures 32 and the spacings therebetween may be configured such that the spacings between the ensuing gate structures are between approximately 70 nm and approximately 200 nm. In this manner, contacts may be formed between the gate structures. Larger or smaller spacings, however, may be employed, depending on the design specifications of the ensuing device structure and the image resolution capabilities of the photolithographic system used to pattern resist structures 32.

As noted above, image resolutions of features patterned using photolithography systems are generally limited by the wavelength of the photolithographic tool. As such, in some embodiments, the widths of resist structures 32 and/or the spacings therebetween may be limited to the minimum dimension obtainable by the photolithography system. In some embodiments, resist structures 32 may be trimmed subsequent to the patterning process to reduce the width of the structures beyond the minimum dimension obtainable by the photolithography system. Such a resist trimming process, however, is not necessarily needed for the method described herein and, therefore, may be omitted in some cases. In addition, resist structures 32 and the spacings therebetween may be patterned to dimensions greater than the minimum dimension obtainable by the photolithography system and, therefore, the method is not necessarily restricted to the widths of resist structures 32 and/or the spacings therebetween.

As shown in FIG. 1, the stack of layers upon which resist structures 32 are arranged may include semiconductor layer 22, layer 24, device layer 26, cap layer 28 and sacrificial layer 30. In some embodiments, semiconductor topography 20 may include additional layers arranged upon and in contact with one or more of the layers shown in FIG. 1. Alternatively, semiconductor topography 20 may include fewer layers than shown in FIG. 1. For example, layer 24 and/or cap layer 28 may be omitted from semiconductor topography 20 in some embodiments. As such, it is noted that several layer configurations may be used for the method described herein and semiconductor topography 20 is merely shown as an exemplary embodiment. In particular, the composition, thickness, number, and arrangement of layers within a semiconductor topography may differ from that described in reference to semiconductor topography 20 for the method described herein. It is further noted that the layers depicted in FIG. 1 may be deposited in manners known in the semiconductor industry for the compositions and thicknesses noted for each respective layer below. Such deposition techniques may include but are not limited to chemical vapor deposition, physical vapor deposition and electroplating. Furthermore, the layers are not necessarily drawn to scale in FIGS. 1-7 such that the processing of semiconductor topography 20 may be clearly shown.

In some cases, semiconductor layer 22 may be a semiconductor substrate such as a monocrystalline silicon, gallium-arsenic, indium phosphide, silicon-germanium, silicon-on-insulator, or silicon-on-sapphire substrate. In such embodiments, semiconductor layer 22 may be doped either n-type or p-type and may include, in some cases, diffusion regions and/or isolation regions may be formed therein. In other cases, semiconductor layer 22 may include structures and layers formed upon a semiconductor substrate. The structures and layers may include, but are not limited to, dielectric layers, metallization layers, gate structures, contact structures, vias, or local interconnect wires. As shown in FIG. 1, semiconductor topography 20 may include layer 24 arranged upon semiconductor layer 22. In some embodiments, such as in cases in which a gate structure will be fabricated from semiconductor topography 20, layer 24 may serve as a gate dielectric. In addition or alternatively, layer 24 may serve as a diffusion barrier layer or an interlevel dielectric between overlying layers and semiconductor layer 22. In such cases, semiconductor topography 20 may be used to pattern an interconnect structure, for example.

In some embodiments, layer 24 may include a dielectric material, such as silicon dioxide ($SiO_2$), silicon nitride ($Si_xN_y$), silicon dioxide/silicon nitride (ON) or silicon dioxide/silicon nitride/silicon dioxide (ONO). Other materials, however, may be appropriate for layer 24, depending on the design specifications of the device. For example, in embodiments in which layer 24 serves as a diffusion barrier layer, layer 24 may include materials known in the semiconductor fabrication industry for having high diffusion barrier properties, such as but not limited to titanium nitride or tantalum nitride. Layer 24 may have a thickness, for example, between approximately 50 angstroms to approximately 5000 angstroms. However, larger and smaller thicknesses of layer 24 may be used depending on the specifications of the device. In yet other embodiments, layer 24 may be omitted from semiconductor topography 20.

Device layer 26 may be formed above semiconductor layer 22 and, in some embodiments, above layer 24 as shown in FIG. 1. Device layer 26 may be used to form a structure of the subsequently formed device. For example, device layer 26 may be used to form gate structures or interconnect lines. As such, device layer 26 may include one or more conductive layers including materials such as, doped amorphous silicon, doped polysilicon, aluminum, copper, molybdenum, tantalum, titanium, tungsten, or any metal alloy, nitride or silicide thereof. In some embodiments, device layer 26 may further include one or more dielectric layers. The dielectric layers may include, for example, silicon dioxide, silicon nitride, silicon oxynitride, ONO or a metal oxide, such as lithium oxide, for example. In any case, device layer 26 may include any number of materials. In addition, device layer 26 may have a thickness, for example, between approximately 300 angstroms to approximately 3000 angstroms. Larger or smaller thicknesses of device layer 26, however, may be appropriate depending on the semiconductor device being formed.

FIG. 1 illustrates cap layer 28 formed above device layer 26. In general, cap layer 28 may serve to isolate device layer 26 from overlying layers and structures. For example, cap layer 28 may, in some cases, serve as a diffusion barrier layer such that impurities in device layer 26 and sacrificial layer 30 may be prevented from diffusing into each other. As such, cap layer 28 may, in some embodiments, include materials known in the semiconductor fabrication industry for having high diffusion barrier properties, such as but not limited to titanium nitride or tantalum nitride. In addition or alternatively, cap layer 28 may serve to insulate device layer 26 from making electrical contact with overlying conductive structures, including those formed prior to and subsequent to the fabrication of the device structures described in reference to FIGS. 1-7. For instance, cap layer 28 may serve to insulate the upper surface of a gate structure formed from device layer 26, particularly for embodiments in which contacts are subsequently formed self-aligned to the gate structure. As such, the materials for cap layer 28 may, in some embodiments, include silicon oxide, silicon nitride, silicon oxynitride, silicon dioxide/silicon nitride or ONO. In some embodiments, cap layer 28 may include silicon nitride and, in some cases, silicon nitride specifically deposited using plasma enhanced chemical vapor deposition techniques. In other embodiments, cap layer 28 may be conductive. For example, cap layer 28 may serve as a strapping layer of ensuing gate structure. In such cases, cap layer 28 may include a metal or metal nitride layer such as, aluminum, copper, tantalum, tungsten, titanium, tungsten nitride, or titanium nitride.

In addition or alternative to serving as an isolating layer for device layer 26, cap layer 28 may serve as an etch stop layer for the patterning of sacrificial layer 30, which is described below in reference to FIG. 2. In particular, cap layer 28 may be configured to include a material with different etch characteristics than the material of sacrificial layer 30 such that the patterning of such a layer may terminate upon exposure and/or within cap layer 28. The inclusion of cap layer 28 within semiconductor topography 20 may be particularly advantageous for embodiments in which sacrificial layer 30 and device layer 26 include similar materials. In particular, the inclusion of cap layer 28 in such cases may advantageously inhibit device layer 26 from being etched during the patterning of sacrificial layer 30. In yet other embodiments, the ensuing device structure fabricated from semiconductor topography 20 may not include an isolation layer and/or etch stop layer and, therefore, cap layer 28 may be omitted from semiconductor topography 20 in some cases. In such cases, sacrificial layer 30 and device layer 26 may include different compositions, particularly those with different etch characteristics. In embodiments in which cap layer 28 is included in semiconductor topography 20, the thicknesses of the layer may generally be between approximately 300 angstroms and approximately 3000 angstroms or, more specifically, between approximately 1000 angstroms and approximately 1500 angstroms. Larger or smaller thicknesses of cap layer 28, however, may be employed depending on the design specifications of the device.

As shown in FIG. 1, sacrificial layer 30 may be formed above device layer 26 and, in some embodiments, above cap layer 28. In general, sacrificial layer 30 may be used to form sacrificial structures at positions to which hardmask features will be relatively formed to pattern a device structure from semiconductor topography 20. Such processes are described in more detail below in reference to FIGS. 2-7. Sacrificial layer 30 may include a material having substantially different etch characteristics or selectivity than the materials of a subsequently deposited hardmask layer and either or both of cap layer 28 and device layer 26, particularly with respect to the etch chemistry used to selectively remove portions of sacrificial layer 30 relative to such layers as described in more detail below in reference to FIG. 5. An exemplary material for sacrificial layer 30 may include polysilicon and may be doped or updoped.

As described in more detail below, polysilicon may be particularly partial to removal in the presence of xenon difluoride ($XeF_2$). Furthermore, $XeF_2$ is generally non-reactive with silicon dielectric materials, and consequently, utilizing polysilicon for sacrificial layer 30 may be advantageous in embodiments in which the subsequently deposited hardmask layer and cap layer 28 include silicon dielectric layers. The term, "silicon dielectric materials" is used herein to refer to dielectric materials including silicon, such as silicon oxide, silicon nitride and silicon oxynitride for example. In addition, $XeF_2$ may generally be less reactive with metallic materials than polysilicon and, therefore, the use of polysilicon for sacrificial layer 30 may be an option in embodiments in which the subsequently deposited hardmask layer, cap layer 28 and/or device layer 26 includes metal.

In any case, the thickness of sacrificial layer 30 may depend on the desired height of the subsequently formed hardmask features. In particular, since the hardmask features will be formed by conformably depositing a material over structures fabricated from sacrificial layer 30 and subsequently removing portions of the material exclusive to the sidewalls of such structures as described in more detail below in reference to FIGS. 3, 4a and 4b, the thickness of sacrificial layer 30 may depend on the height specifications of the hardmask features. As noted below, the height specifications of the subsequently formed hardmask features may depend on the thickness of underlying cap layer 28 and/or device layer 26 as well as the one or more etch chemistries used to pattern the layers in alignment with the hardmask features. As such, the thickness of sacrificial layer 30 may vary for different device fabrications. An exemplary thickness range for sacrificial layer 30, however, may generally be between approximately 700 angstroms and approximately 1000 angstroms. Such a range may be particularly applicable for the fabrication of a gate structure, but may be used for other device structures as well. In addition, larger or smaller thicknesses for sacrificial layer 30 may be employed.

Figure 2:
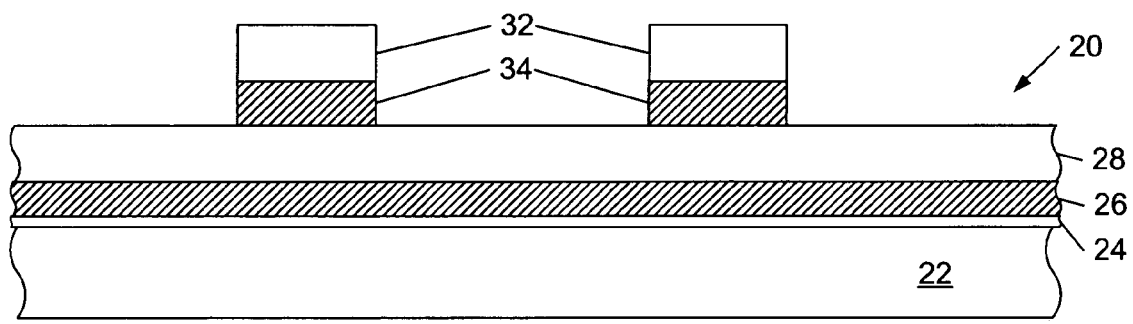
FIG. 2 is a partial cross-sectional view of the semiconductor topography depicted in FIG. 1 subsequent to the patterning of a sacrificial layer from the stack of layers.

Turning to FIG. 2, sacrificial layer 30 is shown patterned in alignment with resist structures 32 to form sacrificial structures 34. In general, the patterning of sacrificial layer 30 may include any wet or dry etch process which is reactive with the material of sacrificial layer 30. In some embodiments, plasma etching in chlorine or fluoride based chemistries may be particularly applicable for patterning sacrificial layer 30. In addition to being reactive with sacrificial layer 30, the etching process may, in some cases, be substantially non-reactive with the materials of cap layer 28 or device layer 26 such that the etching process may substantially terminate upon exposure of such layers (i.e., in embodiments in which cap layer 28 is omitted from semiconductor topography 20, the etch process may be substantially non-reactive with device layer 26 such that the etch process may be terminated upon exposure thereof). For example, the etch process may include plasma etching in an ambient of methane for embodiments in which sacrificial layer 30 comprises polysilicon and cap layer 28 comprises silicon nitride. Other etch techniques and/or etch chemistries, however, may be used to terminate upon cap layer 28 or device layer 26, depending on the design specifications of the device.

Figure 3:
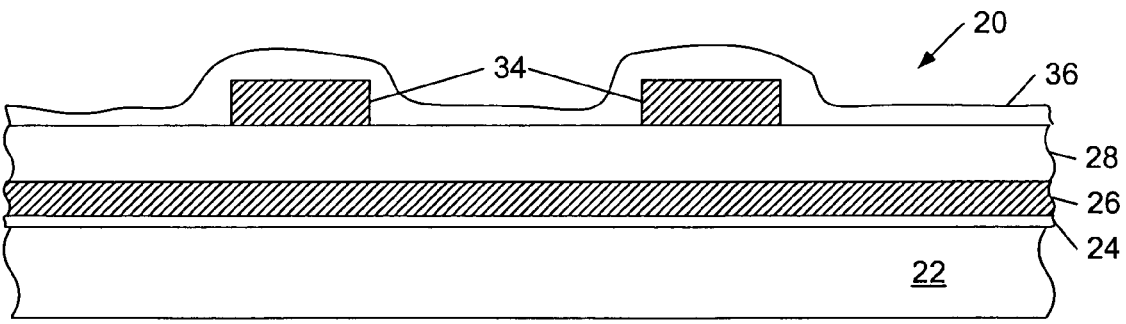
FIG. 3 is a partial cross-sectional view of the semiconductor topography in which a layer is deposited subsequent to the patterning of the sacrificial layer in FIG. 2.

Although not shown in FIG. 2, portions of resist structures 32 may, in some embodiments, be removed during the patterning process of sacrificial layer 30. Alternatively, resist structures 32 may not be etched during such a process. In either case, remaining portions of resist structures 32 may be removed subsequent to patterning sacrificial layer 30 and prior the deposition of hardmask layer 36 as shown in FIG. 3. Such a removal process may be accomplished by a stripping technique such as a wet etch process, a downstream plasma etch process or a reactive ion etch process.

As shown in FIG. 3, hardmask layer 36 may be conformably formed above and about sacrificial structures 34. In addition, hardmask layer 36 may be formed to a thickness such that the upper surface of the layer in the region between sacrificial structures 34 is below the upper surfaces of the sacrificial structures. In this manner, hardmask layer 36 may be subsequently etched to expose upper surfaces of sacrificial structures 34 and portions of cap layer 28 while retaining portions of hardmask layer 36 adjacent to sacrificial structures 34, particularly along the sidewalls of the structures in some embodiments. Such an etch process is described in more detail below in reference to FIGS. 4a-4c. In general, the thickness to which hardmask layer 36 may be formed may be dependent upon the width dimension specification of the ensuring device structure. In particular, since the hardmask features used to pattern the ensuing device structure will be etched from portions of hardmask layer 36, the width of the hardmask features and, thus, the width ensuing device structure will be dependent on the thickness to which hardmask layer 36 is formed rather than the thickness obtainable by a photolithography process.

Since hardmask layer 36 is conformably deposited over sacrificial structures 34, portions of hardmask layer 36 will be thicker along the sidewalls of the structures relative to other positions and, therefore, a variation of thickness within the layer will exist as deposited. The deposition of hardmask layer 36, however, is preferably configured such that the variation of thickness is uniform across semiconductor topography 20, particularly relative to sacrificial structures 34. In particular, the method described herein may include deposition techniques configured such that the thicknesses of hardmask layer 36 relative to particular positions of sacrificial structures 34 are uniform. In this manner, in addition to the adaptations of the process used to etch hardmask layer 36 noted below in reference to FIGS. 4a-4c, device structures patterned from hardmask layer 36 may be substantially uniform. The deposition process of hardmask layer 36 may include but is not limited to chemical vapor deposition, physical vapor deposition and electroplating and may include process parameters, such as temperature, pressure and duration for example, specifically configured for uniform conformal deposition. As well known in the semiconductor fabrication industry, the selection of the deposition technique and process parameters for uniform conformal deposition may depend on the material being deposited, namely hardmask layer 36.

Although the thickness of hardmask layer 36 may vary across semiconductor topography 20 as well as for different applications, an exemplary thickness range may be between approximately 10 nm and approximately 100 nm or, more specifically, between approximately 25 nm and approximately 50 nm. Such a thickness range may be particularly advantageous for forming device structures with dimensions smaller than what may be obtained by conventional photolithography processes and, in some embodiments, what may be obtained by a resist trimming process using such conventional photolithography processes. As noted above, feature sizes of integrated circuits continue to decrease and, consequently, the method described herein offers a manner in which to overcome the limitations and disadvantages of conventional photolithographic and resist trimming processes. In some cases, the method may aid in meeting critical dimensions of integrated circuits, which are continually being reduced with new generations of technologies. Critical dimension, as referred to herein, is the minimum allowable dimension for any given device structure of a circuit. In some technologies, the width specification of a gate structure is the critical dimension of the circuit and, therefore, the method described herein may be particularly applicable for, but not necessarily limited to, the formation of gate structures.

Although the method described herein is specifically discussed above for forming a device structure with a smaller width dimension than what may be obtained by conventional photolithography processes and, in some embodiments, than what may be obtained by a resist trimming process, the method is not so restricted. In particular, the method described herein may be used to pattern device structure having dimensions greater than approximately 100 nm. As such, hardmask layer 36 may be formed to a thickness greater than approximately 100 nm in some cases, depending on the height of sacrificial structures 34 and the spacings therebetween. It is noted that although the height of sacrificial structures 34 has bearing on the thickness to which hardmask layer 36 may be formed, the width of sacrificial structures 34 does not. As such, the method described herein does not necessarily need to utilize a lithographic tool with a particular image resolution to fabricate sacrificial structures 34. Rather, the image resolution of the lithographic tool used to form sacrificial structures 34 influences the width specifications of the spacings between the ensuing device structures fabricated from semiconductor topography 20 as described above in reference to FIG. 2. As such, in addition to offering a manner in which to pattern device structures to smaller dimensions than which may be obtainable by photolithographic tools, the method described herein may, in some embodiments, offer a cost-effective alternative to upgrading to costly new generation photolithographic tools having smaller image resolutions. In particular, the purchase of new photolithographic tools may be avoided with each technology involving a critical dimension reduction.

Regardless of its deposition thickness, hardmask layer 36 may include a material having substantially different etch characteristics than sacrificial structures 34, particularly in reference to the etching process of hardmask layer 36 and the removal of sacrificial structures 34 described below in reference to FIGS. 4a-4c and 5. As described above, silicon dielectric materials are generally non-reactive with $XeF_2$, which is presented below as an exemplary etch chemistry which may be used to remove sacrificial structures 34. As such, it may, in some embodiments, be advantageous for hardmask layer 36 to include a silicon dielectric material, such as but not limited to silicon oxide, silicon nitride and silicon oxynitride. In other embodiments, hardmask layer 36 may include a metal. For example, hardmask layer 36 may include aluminum, copper, molybdenum, tantalum, titanium, tungsten, or any metal alloy, nitride or silicide thereof.

In any case, it may be further advantageous for hardmask layer 36 to have different etch characteristics than cap layer 28 or, in cases in which cap layer 28 is omitted from semiconductor topography 20, different etch characteristics than device layer 26. In this manner, cap layer 28 or device layer 26 may serve as an etch stop layer during the etching of hardmask layer 36 described below in reference to FIGS. 4a-4c. As such, in some embodiments, it may be advantageous for hardmask layer 36 to include a different material composition than cap layer 28 and, in some cases, a different material composition than device layer 26. For example, in some embodiments, hardmask layer 36 may include silicon oxide and cap layer 28 may include silicon nitride. Other material combinations having different etch characteristics may also be used for hardmask layer 36, cap layer 28 and/or device layer 26, depending on the design specifications of the device.

Figure 4A:
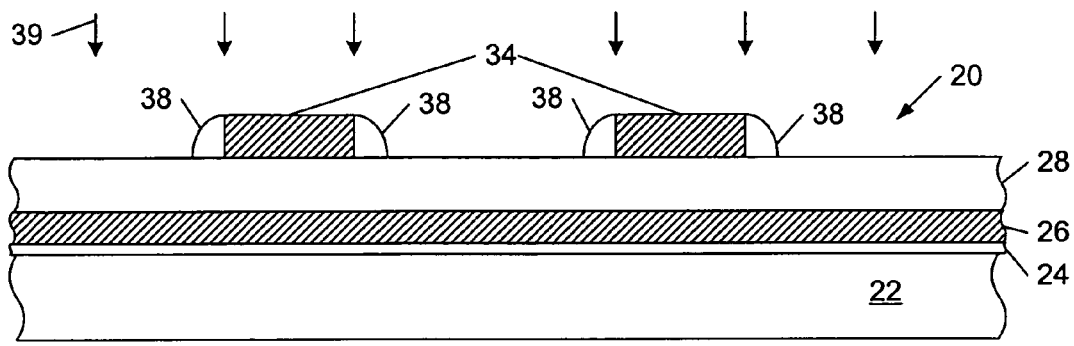
FIG. 4a is a partial cross-sectional view of the semiconductor topography depicted in FIG. 3 subsequent to the removal of portions of the deposited layer.
Figure 4B:
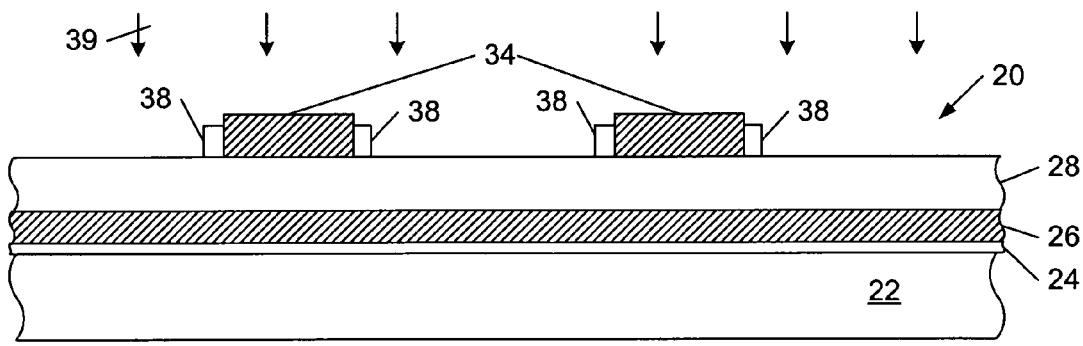
FIG. 4b is a partial cross-sectional view of the semiconductor topography depicted in FIG. 3 subsequent to the removal of portions of the deposited layer in an alternative embodiment.

Subsequent to its deposition, portions of hardmask layer 36 may be etched to form hardmask features 38 as illustrated in FIGS. 4a and 4b, which depict topography results from different removal techniques. In particular, hardmask layer 36 may be etched to expose upper surfaces of sacrificial structures 34 and portions of cap layer 28 while retaining portions of hardmask layer 36 adjacent to sacrificial structures 34. Such a removal process may be conducted by blanket etching semiconductor topography 20. Blanket etching, as used herein, may refer to etch process which does not employ resist structures or hardmask features to pattern the topography. As such, the entire upper surface of hardmask layer 36 is exposed to an etching process. Since hardmask layer 36 was conformably deposited over sacrificial structures 34, portions of hardmask layer 36 will be thicker along the sidewalls of the structures. As a consequence, the blanket etching process may be configured to terminate prior to removing the entirety of the layer, forming hardmask features 38 along the sidewalls of sacrificial structures 34. In some embodiments, the blanket etching process may be configured to anisotropically etch hardmask layer 36 such that the outer sidewall surfaces of hardmask features 38 are formed with a convex profile extending from the upper surface of sacrificial structures 34 to the upper surface of cap layer 28 as shown in FIG. 4a. In other embodiments, the blanket etching process may be configured to uniformly etch hardmask layer 36 such that the upper surface of hardmask features 38 are below the upper surface of sacrificial structures 34 as shown in FIG. 4b.

As noted above, hardmask layer 36 is preferably deposited to a thickness such that the width of hardmask features 38 formed therefrom are within the width specifications of the ensuing device structure. In addition, the etch process is preferably configured to form hardmask features 38 within the width specifications of the ensuing device. In this manner, hardmask features 38 may be used to pattern the structure rather than a photolithography process tool. Furthermore, the etch process is preferably configured to form hardmask features 38 with substantially uniform base widths such that device structures may be fabricated without substantial dimensional variation. In general, such adaptations of the etch process may include but are not limited to the etch technique and etch chemistry used as well as the temperature and duration of the process.

In addition, sacrificial layer 30 or, more specifically, sacrificial structures 34 are preferably formed with a thickness such that the height of hardmask features 38 is sufficient to etch cap layer 28 and/or device layer 26 in alignment thereto and to thicknesses within the design specifications of the device. More specifically, hardmask features 38 are preferably formed to a height sufficient such that cap layer 28 and/or device layer 26 are not reduced to thicknesses smaller than the design specifications of the device during the patterning processes of the ensuing device structure. The correlation of the height of hardmask features 38 to the etching of cap layer 28 and device layer 26 is described in more detail below in reference to FIGS. 6 and 7. As noted in reference to FIGS. 6 and 7, it may, in some embodiments, be advantageous to have the patterning processes of cap layer 28 and/or device layer 26 remove all portions of hardmask features 38 such that the fabrication process does not need to include an additional stripping process to remove remaining portions of the hardmask features. As such, the height of hardmask features 38 may, in some embodiments, be optimized to realize both objectives of forming the ensuing device structure to a thickness within the design specifications of the device and avoiding the need to include an additional hardmask removal step in the fabrication process.

It is noted that although four hardmask features are shown fabricated in FIGS. 4a and 4b, any number of hardmask features may be formed upon semiconductor topography 20 in accordance with design specifications of the ensuing device. In addition, the method described herein is not restricted to the formation of hardmask features along all sidewalls of patterned sacrificial structures 34. In particular, the method may, in some embodiments, include an additional process step of masking one or more sidewalls of patterned sacrificial structures 34 prior to the deposition of hardmask layer 36. In this manner, a hardmask feature may not be formed along such sidewalls. In such embodiments, the masking layer may be removed prior to the patterning of the ensuing device structures, including prior to, during and/or subsequent to the removal of sacrificial structures 34 which is described below in reference to FIG. 5.

Figure 4C:
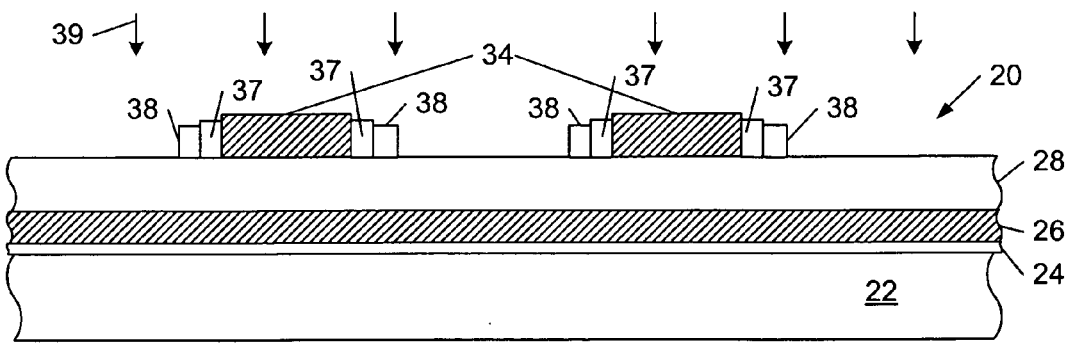
FIG. 4c is a partial cross-sectional view of the semiconductor topography depicted in FIG. 2 subsequent to the deposition of a first layer followed by a partial removal of the first layer and further subsequent to the deposition of a second layer upon the remaining portions of the first layer followed by a partial removal of portions of the second layer such that remaining portions of the second layer are adjacent to remaining portions of the first layer.

Furthermore, the method described herein is not necessarily restricted to the formation of hardmask features along sidewalls of patterned sacrificial structures 34. In particular, the method may, in some embodiments, include the deposition and blanket etching of a spacing layer prior to the deposition of hardmask layer 36. In such embodiments, sidewall spacers of the spacing layer may be formed along one or more of the sidewalls of sacrificial structures 34 and hardmask features 38 may be formed along the sidewalls of such spacers. An illustration of semiconductor topography 20 resulting from such a process is depicted in FIG. 4c. In particular, FIG. 4c shows hardmask features 38 spaced adjacent to the sidewalls of patterned sacrificial structures 34 by sidewall spacers 37. In general, sidewall spacers 37 may be formed similar to the manner described in reference to hardmask features 38. As such, the thickness of sidewall spacers 37 may vary widely depending on the design specifications of the device, but an exemplary range may be between approximately 25 nm and approximately 1000 nm.

The formation of sidewall spacers 37 may be particularly advantageous for forming hardmask features 38 closer together than in cases in which sidewall spacers 37 are not formed, as shown by comparing hardmask features 38 interposed between sacrificial structures 34 in FIG. 4c with such features in FIGS. 4a and 4b. As a result, device structure fabricated from the device structures may be fabricated closer together. In some embodiments, the formation of sidewall spacers 37 may facilitate the formation of device structures spaced apart by distances less than what may be obtainable by the photolithographic tool used to pattern sacrificial structures 34, although the method is not so restricted.

In any case, sidewall spacers 37 may, in some embodiments, be removed prior to the patterning of the ensuing device structures, including prior to, during and/or subsequent to the removal of sacrificial structures 34. In this manner, sidewall spacers 37 may serve as sacrificial structures. Consequently, sidewall spacers 37 may include a material having different etch characteristics than hardmask features 38 and cap layer 28 and, in some embodiments, different etch characteristics than device layer 26 such that the spacers may be selectively removed in relation to the hardmask features. In other embodiments, sidewall spacers 37 may be used in conjunction with hardmask features 38 to pattern a device structure from semiconductor topography 20 and, therefore, may include a material with similar etch characteristics as the hardmask features. In either case, sidewall spacers 37 may include a material with different etch characteristics than sacrificial structures 34 such that the spacers may be selectively formed without substantially etching portions of sacrificial structures 34. Depending on the materials of sacrificial structures 34, hardmask features 38, cap layer 28 and, in some embodiments, device layer 26, sidewall spacers 37 may, in some embodiments, include a silicon dielectric material, such as silicon oxide, silicon nitride or silicon oxynitride. In other embodiments, sidewall spacers 37 may include a metal layer such as, aluminum, copper, molybdenum, tantalum, titanium, tungsten, or any metal alloy, nitride or silicide thereof.

In some embodiments, the method described herein may include a cleaning process subsequent to the formation of hardmask features 38 to remove any chemical or native oxides formed from the previous process steps, particularly on the upper surfaces of sacrificial structures 34. Such a cleaning process is denoted in FIGS. 4a-4c by reference number 39. As noted below in reference to FIG. 5, sacrificial structures 34 are removed after the formation of hardmask features 38 and such a removal process is preferably non-reactive with the material of hardmask features 38. As such, in embodiments in which hardmask features 38 includes an oxide material, such as silicon oxide for example, it may be advantageous to remove oxides from the upper surfaces of sacrificial structures 34 such that the entirety of the upper surface of sacrificial structures 34 are exposed for subsequent release. In addition, it may be advantageous to remove oxides from the upper surface of cap layer 28 and/or sidewall spacers 37.

Cleaning process 39 may generally include any wet or dry clean techniques used in the semiconductor fabrication industry for removing surface oxides without substantially etching oxide structures of the semiconductor topography. For example, cleaning process 39 may include exposing semiconductor topography 20 to a highly diluted solution of hydrofluoric acid tailored to remove about 5 angstroms to about 25 angstroms of oxide to minimize the dimension loss of oxide structures within the topography. Alternatively, cleaning process 39 may include exposing semiconductor topography 20 to a standard dry clean process using $CF_4$, $CHF_3$, or $O_2/Ar$ chemistry. An argon sputter etch may also or alternatively be used for cleaning process 39.

Figure 5:
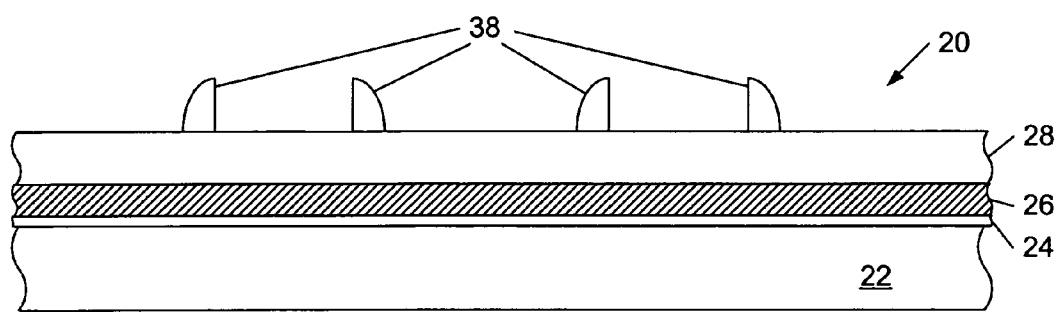

Turning to FIG. 5, semiconductor topography 20 is shown with sacrificial structures 34 removed or "released" subsequent to the formation of hardmask features 38 in FIG. 4a. It is noted that such a process, as well as the processes described in reference to FIGS. 6 and 7 below, may also be applied to the topographies of FIGS. 4b and 4c. In general, the removal of sacrificial structures 34 may include any technique which is highly reactive with the material of sacrificial structures 34 and substantially non-reactive with the material of hardmask features 38 and, in some cases, substantially non-reactive with the material of cap layer 28. An exemplary process includes exposing semiconductor topography 20 to an ambient of $XeF_2$ and is referred to herein as the "$XeF_2$ release process." The $XeF_2$ release process may be particularly applicable, but is not necessarily limited to embodiments in which hardmask features 38 and cap layer 28 include silicon dielectric materials and sacrificial structures 34 include polysilicon.

In some cases, the $XeF_2$ release process may include purging the chamber in which semiconductor topography 20 is positioned with a gas such as nitrogen, for example, prior to exposing semiconductor topography 20 with $XeF_2$. The chamber may include the vessel in which hardmask features 34 were formed or may include a different vessel. In either embodiment, the chamber may be subsequently evacuated down to a moderate vacuum. The $XeF_2$ is sublimated in a separate container to a pressure of about 4 mTorr (i.e., the vapor pressure of $XeF_2$) and then introduced into the chamber comprising semiconductor topography 20 to remove sacrificial structures 34. In some embodiments, the $XeF_2$ release process may be performed in vapor phase at a pressure of approximately 60 mTorr, at room temperature and with no external energy sources. Under such conditions, a highly selective and isotropic etch of polysilicon has been observed with rates between approximately 2 microns per minute and approximately 4 microns per minute. It is noted that the $XeF_2$ release process may be performed at larger or smaller pressures and temperatures and/or with external energy sources and result in sufficient removal rates of the sacrificial structures. The aforementioned conditions are merely presented as an exemplary embodiment. A further benefit which has been observed with the $XeF_2$ release process is that silicon dielectric materials are not removed by the process. Consequently, in embodiments in which hardmask features 38 and cap layer 28 include silicon dielectric materials, the $XeF_2$ release process may not remove portions of such features and layers.

It is noted that although the method described herein is described specifically with reference to sacrificial structures 34 including polysilicon and hardmask features 38 and cap layer 28 including silicon dielectric materials for the highly selective $XeF_2$ release process of sacrificial structures 34, the method is not necessarily restricted to such materials or the use of the $XeF_2$ release process. In particular, the method described herein may be used with any of the materials noted above for the respective structures and layers of semiconductor topography 20. In addition, the method may include other release processes which are configured to be highly reactive with materials of sacrificial structures 34 and substantially non-reactive with materials of hardmask features 38, cap layer 28 and/or device layer 26.

Figure 6:
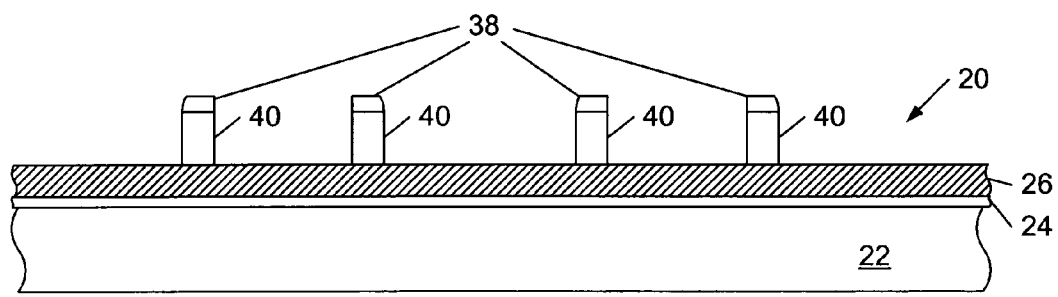
FIG. 6 is a partial cross-sectional view of the semiconductor topography in which underlying portions of the stack of layers are patterned in alignment with the remaining portions of the deposited layer subsequent to the removal of the remaining portions of the sacrificial layer in FIG. 5.

As illustrated in FIG. 6, portions of cap layer 28 may be etched in alignment with hardmask features 38 to form patterned cap portions 40. In general, the etching of cap layer 28 may include a process which is highly reactive with the material of cap layer 28 and substantially less reactive with the material of hardmask features 38. For example, the etching process may include exposing semiconductor topography 20 to a plasma formed from a gas composition including $CHF_3$ introduced at a flowrate of approximately 275 sccm and $CF_4$ introduced at a flowrate of approximately 300 sccm. Exemplary process parameters of such an etch process may include pressure at approximately 30 mTorr, power of approximately 500 W, and a temperature of approximately 60° C. Such an exemplary process may be particularly applicable in embodiments in which cap layer 28 includes silicon nitride. The process may, however, be applied for other materials of cap layer 28 as well. In addition, larger or smaller pressures, power and/or temperatures may be used. Moreover, different etch chemistries and/or flowrates may be used as well as etch techniques other than those using a plasma. In some cases, the etch process may be configured to over-etch semiconductor topography 20 beyond the interface of cap layer 28 and device layer 26, such as by approximately 20% for example, to insure the entirety of the exposed portions of cap layer 28 are removed.

As shown in FIG. 6, the etching of cap layer 28 may, in some embodiments, include removing a portion of hardmask features 38. The etch process and/or the height of hardmask features 38, however, may be configured such that portions of the hardmask features remain subsequent to the formation of patterned cap portions 40 as illustrated in FIG. 6. An exemplary thickness range for portions of hardmask features 38 remaining subsequent to the formation of patterned cap portions 40 may be between approximately 50 angstroms and approximately 500 angstroms, however, larger or smaller thicknesses of the hardmask features may remain. In other embodiments, portions of hardmask features 38 may not be removed during the formation of patterned cap portions 40. In yet other cases, the entirety of hardmask features 38 may be removed during the formation of patterned cap portions 40. In such embodiments, the thickness of patterned cap portions 40 may, in some cases, be reduced relative to the thickness of cap layer 28 due to the exposure of their upper surfaces to the etch process. In yet other embodiments, cap layer 28 may be omitted from semiconductor topography 20 and, therefore, in some cases, the etch process described in reference to FIG. 6 may be omitted from the method described herein.

Figure 7:
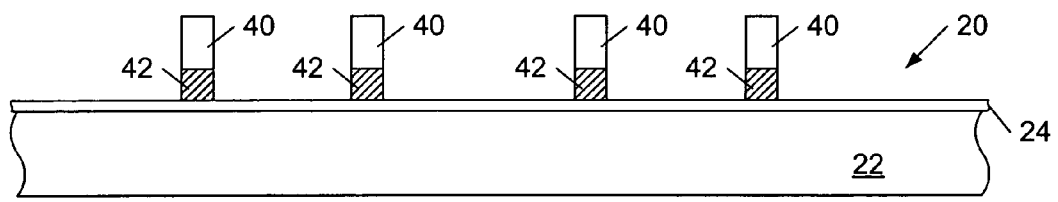
FIG. 7 is a partial cross-sectional view of the semiconductor topography depicted in FIG. 6 subsequent to further patterning of the underlying portions of the stack of layers.

Turning to FIG. 7, portions of device layer 26 may be patterned in alignment with remaining portions of hardmask layer 38 and patterned cap portions 40 to form device structures 42. In general, the patterning of device layer 26 may include an etch process which is highly reactive with the material of device layer 26 and substantially less reactive with the material of patterned cap portions 40. For example, the etching process may include exposing semiconductor topography 20 to hydrogen bromide (HBr) at a flow rate of approximately 250 sccm and an 80% helium/20% oxygen gas mixture at a flow rate of approximately 12 sccm. Exemplary process parameters for such an etching process may include power of approximately 450 W, a bias power of approximately 40 W, a pressure of approximately 25 mTorr, and a temperature of approximately 60° C. Such an exemplary process may be particularly applicable in embodiments in which device layer 26 includes doped polysilicon, but the process may be applied for other materials of device layer 26 as well. In addition, larger or smaller pressures, power and/or temperatures may be used. Moreover, other etch chemistries and/or flowrates may be used, depending on the composition of layers within semiconductor topography 20.

In some cases, the etch process used to form device structures 42 may be configured to over-etch semiconductor topography 20 beyond the interface of device layer 26 and layer 24 to insure the entirety of the exposed portions of device layer 26 are removed. In other words, portions of layer 24 may be etched during the formation of device structures 42. Exemplary process parameters for an over-etch process may include but is not limited to an HBr flow rate of approximately 150 sccm, a 80% helium/20% oxygen gas mixture flow rate of approximately 8 sccm, a helium flow rate of approximately 100 sccm, power of approximately 200 W, a bias power of approximately 70 W, a pressure of approximately 70 mTorr and a temperature of approximately 60° C. for a time of approximately 63 seconds. Different etch chemistries, flowrates, power, pressures, temperatures and/or time durations, however, may be used for an over-etch process, depending on the design specifications of the ensuing device. Regardless of whether such an over-etch process is used, the method may, in some embodiments, include patterning layer 24 in alignment device structures 42 during the patterning process of device structures 42 or subsequent thereto. In yet other embodiments, layer 24 may not be etched.

As shown in FIG. 7, the etching of device layer 26 may include removing remaining portions of hardmask features 38 in some embodiments. Consequently, the thickness of patterned cap portions 40 and/or device structures 42 may, in some embodiments, be reduced relative to the thickness of device layer 26 due to the exposure of their upper surfaces during the etch process. In some embodiments, the entirety of patterned cap portions 40 may be removed during or subsequent to the formation of device structures 42. In other cases, however, the etch process and/or the height of hardmask features 38 may be configured such that the resulting thickness of patterned cap portions 40 is within the design specifications of the device. An exemplary resulting thickness for patterned cap portions 40 in such embodiments may generally be between approximately 500 angstroms and approximately 1500 angstroms or, more specifically, around approximately 1000 angstroms, however, larger or smaller thicknesses of patterned cap portions 40 may remain. In other embodiments, the etch process and/or the height of hardmask features 38 may be configured such that portions of the hardmask features remain subsequent to the formation of device structures 42. In this manner, the upper surfaces of patterned cap portions 40 and/or device structures 42 may be protected from the etching process. In such embodiments, the remaining portions of hardmask features 38 may be removed subsequent to the formation of device structures 42 by any wet or dry stripping techniques known for removing the material of the hardmask features without substantially removing the materials of patterned cap portions 40 and/or device structures 42.

As noted above, the method described herein may be particularly advantageous for forming device structures having width dimensions smaller than what may be obtained by conventional photolithography processes and, in some embodiments, what may be obtained by a resist trimming process using such conventional photolithography processes. As such, the method may be used to form device structures having width dimensions less than approximately 70 nm and, in some embodiments, less than approximately 55 nm or even less than approximately 25 nm. In addition to the ability of forming device structures with such small width dimensions, the method may be beneficial for forming a plurality of device structures with substantially uniform width dimensions. In particular, the method may be capable of forming a plurality of device structures having a variation of the widths less than approximately 10% or, more specifically, less than approximately 5%. As such, the advantage of the method described herein over previous or conventional patterning techniques include a small and highly uniform width dimension for a patterned device structure as it is dependent on the thickness of a hardmask sidewall spacer and not on the capabilities of a lithographic tool.

Further processing of semiconductor topography 20 may be conducted subsequent to the patterning of device structures 42. For example, in some cases, an interlevel dielectric layer may be deposited upon semiconductor topography 20 to insulate the device structures. Thereafter, a contact or via opening may be formed within the dielectric layer and subsequently filled to form a contact or via in contact with the upper surface of semiconductor layer 22 and, in some cases, with the upper surface of cap layer 40 when a self-aligned contact process is employed. In addition, other layers or structures may be formed upon semiconductor topography 20 subsequent to the patterning of device structures 42.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method for processing a semiconductor topography, comprising:
   forming a hardmask feature spaced adjacent to a patterned sacrificial structure of the semiconductor topography;
   selectively removing the patterned sacrificial structure to expose an underlying layer; and
   etching exposed portions of the underlying layer in alignment with the hardmask feature, wherein the step of forming the hardmask feature comprises:
      conformably depositing a spacing layer above the patterned sacrificial structure and adjacent regions of the underlying layer;
      blanket etching the spacing layer such that:
         upper surfaces of the patterned sacrificial structure and portions of the adjacent regions of the underlying layer are exposed; and
         portions of the spacing layer remain along one or more sidewalls of the patterned sacrificial structure;
      conformably depositing a hardmask material upon the semiconductor topography subsequent to the step of blanket etching the spacing layer; and
      blanket etching the hardmask material such that:
         upper surfaces of the patterned sacrificial structure and portions of the underlying layer adjacent to the etched spacing layer are exposed; and
         portions of the hardmask material remain along sidewalls of the etched spacing layer.

2. The method of claim 1, wherein the step of forming the hardmask feature comprises forming the hardmask feature with a maximum width less than approximately 70 nm.

3. The method of claim 1, wherein the step of forming the hardmask feature comprises forming the hardmask feature with a maximum width equal to or less than approximately 55 nm.

4. The method of claim 1, wherein the patterned sacrificial structure comprises polysilicon, and wherein the hardmask feature comprises silicon dielectric materials.

5. The method of claim 1, wherein the step of selectively removing the patterned sacrificial structure comprises exposing the semiconductor topography to $XeF_2$.

6. The method of claim 1, wherein the step of etching the exposed portions of the underlying layer comprises forming gate structures of the semiconductor topography.

7. The method of claim 1, wherein the step of etching the exposed portions of the underlying layer comprises forming interconnect lines of the semiconductor topography.

8. The method of claim 1, wherein the etched spacing layer comprises a maximum width between approximately 25 nm and approximately 1000 nm.

9. The method of claim 1, wherein the step of etching the exposed portions of the underlying layer comprises forming elements of the semiconductor topography comprising dimensions less than approximately 70 nm.

10. The method of claim 9, wherein the dimensions among the elements vary by less than approximately 10%.

11. A method for processing a semiconductor topography, comprising:
- conformably depositing a hardmask material above a patterned sacrificial structure and adjacent regions of a lower layer of the semiconductor topography, wherein the patterned sacrificial structure comprises a thickness between approximately 700 angstroms and approximately 1000 angstroms;
- blanket etching the hardmask material such that:
  - upper surfaces of the patterned sacrificial structure and portions of the adjacent regions of the lower layer are exposed; and
  - portions of the hardmask material remain along sidewalls of the patterned sacrificial structure;
- selectively removing the sacrificial structure to expose an underlying region of the lower layer;
- etching exposed portions of the adjacent and underlying regions of the lower layer in alignment with the remaining portions of the hardmask material to form patterned portions of the lower layer, wherein the step of etching the exposed portions of the lower layer exposes portions of a device layer underlying the lower layer; and
- etching exposed portions of the device layer in alignment with the remaining portions of the hardmask material and patterned portions of the lower layer, wherein the step of etching the exposed portions of the device layer comprises removing the remaining portions of the hardmask material.

12. The method of claim 11, wherein the step of blanket etching the hardmask material comprises blanket etching the hardmask material such that portions of the hardmask layer remaining along the sidewalls of the patterned sacrificial structure comprise a maximum width of less than approximately 70 nm.

13. The method of claim 11, wherein the step of blanket etching the hardmask material comprises anisotropically etching the hardmask material.

14. The method of claim 11, wherein the step of blanket etching the hardmask material comprises uniformly etching the hardmask material.

15. The method of claim 11, wherein the step of selectively removing the sacrificial structures comprises exposing the semiconductor topography to $XeF_2$.

* * * * *